United States Patent
Lee et al.

(10) Patent No.: US 9,343,132 B2
(45) Date of Patent: May 17, 2016

(54) MRAM WRITE PULSES TO DISSIPATE INTERMEDIATE STATE DOMAINS

(71) Applicant: Headway Technologies, Inc., Milpitas, CA (US)

(72) Inventors: Yuan-Jen Lee, Fremont, CA (US); Po-Kang Wang, Los Altos, CA (US); Guenole Jan, San Jose, CA (US)

(73) Assignee: Headway Technologies, Inc., Milpitas, CA (US)

(*) Notice: Subject to any disclaimer, the term of this patent is extended or adjusted under 35 U.S.C. 154(b) by 118 days.

(21) Appl. No.: 13/899,623

(22) Filed: May 22, 2013

(65) Prior Publication Data
US 2014/0347918 A1    Nov. 27, 2014

(51) Int. Cl.
| | |
|---|---|
| *G11C 11/16* | (2006.01) |
| *G11C 11/00* | (2006.01) |
| G11C 29/12 | (2006.01) |
| G11C 29/56 | (2006.01) |

(52) U.S. Cl.
CPC ............ *G11C 11/1675* (2013.01); *G11C 11/00* (2013.01); *G11C 29/12015* (2013.01); *G11C 29/56* (2013.01)

(58) Field of Classification Search
CPC ........ G11C 11/00; G11C 11/16; B82Y 25/00; H01F 1/3254
USPC ............. 365/158, 171, 148, 185.19; 327/291; 977/935
See application file for complete search history.

(56) References Cited

U.S. PATENT DOCUMENTS

| | | | |
|---|---|---|---|
| 7,577,023 B2 | 8/2009 | Philipp et al. | |
| 7,852,657 B2 | 12/2010 | Happ et al. | |
| 7,936,592 B2* | 5/2011 | Wang et al. | 365/158 |
| 8,198,919 B1 | 6/2012 | Kozhanov et al. | |
| 8,289,762 B2 | 10/2012 | Kau et al. | |
| 8,792,269 B1* | 7/2014 | Abedifard et al. | 365/158 |
| 2008/0253174 A1 | 10/2008 | Yoshikawa et al. | |
| 2011/0013448 A1* | 1/2011 | Nozieres et al. | 365/173 |
| 2011/0051502 A1* | 3/2011 | Rao et al. | 365/158 |
| 2011/0273926 A1 | 11/2011 | Wu et al. | |

(Continued)

OTHER PUBLICATIONS

Lee, "Analytical investigation of spin-transfer dynamics using a perpendicularto-plane polarizer", Appl. Phys. Lett. 86, 022505 (2005).*

"Current-driven excitation of magnetic multilayers," by J.C. Slonczewski, Journal of Magnetism and Magnetic Materials, 159, Jun. 1996, L1-L7, Elsevier Science B. V.

(Continued)

*Primary Examiner* — Han Yang
*Assistant Examiner* — Xiaochun L Chen
(74) *Attorney, Agent, or Firm* — Saile Ackerman LLC; Stephen B. Ackerman (57) ABSTRACT

A write method for a STT-RAM MTJ is disclosed that substantially reduces the bit error rate caused by intermediate domain states generated during write pulses. The method includes a plurality of "n" write periods or pulses and "n−1" domain dissipation periods where a domain dissipation period separates successive write periods. During each pulse, a write current is applied in a first direction across the MTJ and during each domain dissipation period, a second current with a magnitude equal to or less than the read current is applied in an opposite direction across the MTJ. Alternatively, no current is applied during one or more domain dissipation periods. Each domain dissipation period has a duration of 1 to 10 ns that is equal to or greater than the precession period of free layer magnetization in the absence of spin torque transfer current.

39 Claims, 7 Drawing Sheets

(56) References Cited

U.S. PATENT DOCUMENTS

| | | |
|---|---|---|
| 2012/0199895 A1 | 8/2012 | Nitta |
| 2013/0013977 A1 | 1/2013 | Rivers et al. |
| 2013/0155760 A1* | 6/2013 | Houssameddine ........... 365/158 |
| 2013/0230741 A1* | 9/2013 | Wang et al. ................... 428/826 |

OTHER PUBLICATIONS

"A Study of Write Margin of Spin Torque Transfer Magnetic Random Access Memory Technology," by Tai Min et al., IEEE Transactions on Magnetics, vol. 46, No. 6, Jun. 2010, pp. 2322-2327.

* cited by examiner

MRAM WRITE PULSES TO DISSIPATE INTERMEDIATE STATE DOMAINS

TECHNICAL FIELD

The present disclosure relates to a high performance Magnetic Tunneling Junction (MTJ) memory element in a spin transfer torque (STT-MRAM) device, and in particular, to an integrated circuit and improved write method that is employed to dissipate intermediate state domains in the MTJ and thereby reduce the bit error rate (BER) during a write process.

BACKGROUND

Magnetoresistive Random Access Memory (MRAM), based on the integration of silicon CMOS with MTJ technology, is a major emerging technology that is highly competitive with existing semiconductor memories such as SRAM, DRAM, and Flash. Recently, a spin transfer torque (STT) magnetization switching design described by C. Slonczewski in "Current driven excitation of magnetic multilayers", J. Magn. Magn. Mater. V 159, L1-L7 (1996), has been extensively studied as a candidate for memory applications because of its nonvolatility, fast write time, and scalability with CMOS technology.

Figure 1:
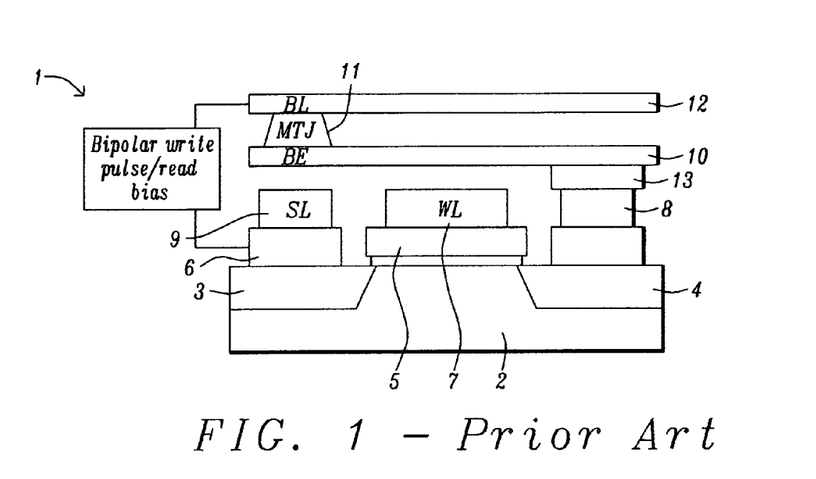
FIG. 1 is a cross-sectional view showing a memory cell in a conventional STT-MRAM device.

As shown in FIG. 1, one version of a STT-MRAM memory cell 1 has a transistor 3 connected in series with a magnetic tunnel junction (MTJ) 11. The transistor includes a gate 5 formed above a p-type semiconductor substrate 2, a source 3, and a drain 4, and is controlled by a word line (WL) 7 that is located above the gate. A bottom surface of the MTJ is connected to the drain through a bottom electrode (BE) 10, via 13, and a Cu stud 8. Source line 9 is connected through a Cu stud 6 to bit line (BL) 12 which contacts a top surface of the MTJ. During a read or write operation, a DC current flows across the MTJ from top surface to bottom surface, or vice versa, depending on the voltage applied to BL 12 and to source line (SL) 9.

Similar to MRAM, STT-RAM has a MTJ based on a tunneling magneto-resistance (TMR) effect wherein a stack of layers has a configuration in which two ferromagnetic layers are separated by a thin non-magnetic dielectric layer called a tunnel barrier layer. One ferromagnetic layer has a magnetization that is fixed in a first direction and is often referred to as a reference layer. The second ferromagnetic layer is referred to as the free layer and has a magnetization that is able to switch to a direction which is either parallel or anti-parallel to the first direction. A parallel magnetization condition is called a "0" memory state while a condition where anti-parallel magnetizations exist for the reference layer and free layer is a "1" memory state. During a read process, the "0" memory state is detected by measuring a lower resistance value across the MTJ than for a "1" memory state. A write process involves setting BL voltage to 0 and SL to a high voltage, or setting SL to 0 volts and BL at a high voltage to drive current across the MTJ. The resulting write current must be greater than the critical current needed for the free layer switching process. Moreover, the current used for the read operation is usually an order of magnitude less than that of the write operation to avoid accidently switching the free layer magnetization direction.

STT-MRAM has an advantage over conventional MRAM in avoiding the well known half select issue and writing disturbance between adjacent cells. The spin-transfer effect arises from the spin dependent electron transport properties of ferromagnetic-spacer-ferromagnetic multilayers. When a spin-polarized current transverses a magnetic multilayer in a current perpendicular-to-plane (CPP) configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small.

For STT-MRAM to be viable in the 90 nm technology node and beyond, the ultra-small MTJs (also referred to as nanopillars or nanomagnets) must exhibit a TMR ratio that is much higher than in a conventional MRAM MTJ which uses AlOx as the tunnel barrier and a NiFe free layer. TMR ratio is $(R_{AP}-R_P)/R_P$ where $R_{AP}$ is the resistance of the aforementioned anti-parallel state and $R_P$ is the resistance value for the parallel state. Furthermore, critical current density (Jc) must be lower than about $10^6$ A/cm$^2$ to be driven by a CMOS transistor that can typically deliver 100 µA per 100 nm gate width. A critical current for spin transfer switching (Ic), which is defined as $[(Ic^{+}+Ic^{-})/2]$, for a 180 nm node sub-micron MTJ having a top-down oval shaped area of about 0.2×0.4 micron, is generally a few milliamperes. Critical current density (Jc), for example (Ic/A), is on the order of several $10^7$ A/cm$^2$. This high current density, which is required to induce the spin-transfer effect, could destroy a thin tunnel barrier made of AlOx, MgOx, or the like. Thus, for high density devices such as STT-RAM on a gigabit scale, it is desirable to decrease Ic (and its Jc) by about an order of magnitude to avoid an electrical breakdown of the MTJ device and to be compatible with the underlying CMOS transistor that is used to provide switching current and to select a memory cell.

Figure 2:
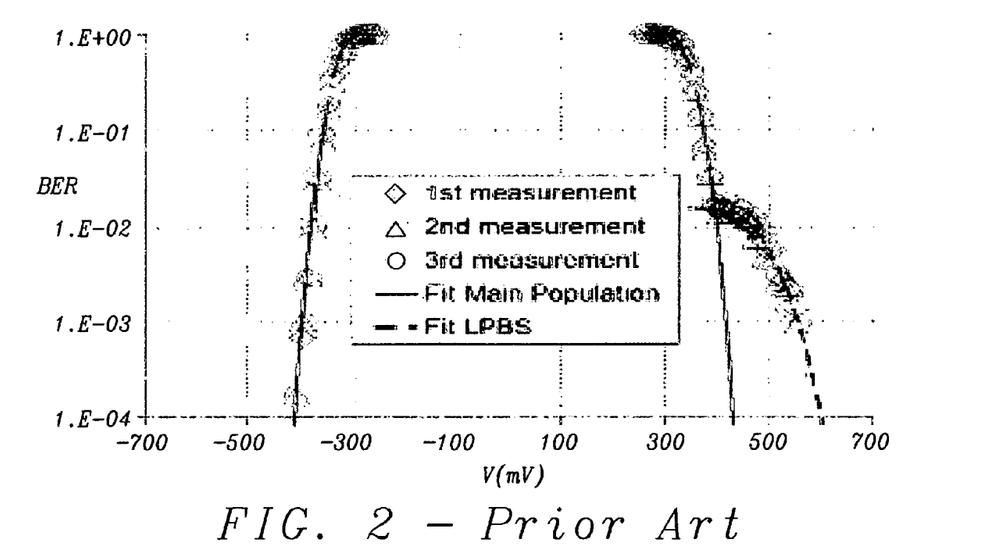
FIG. 2 is a plot of bit error rate (BER) vs. applied voltage that is measured three times for a single MTJ during a typical write process and demonstrates an abnormal bifurcated switch process at lower probabilities that is repeatable.

STT-MRAM has been plagued by intermediate states during a write process. T. Min et al. in "A Study of Write Margin of Spin Torque Transfer Magnetic Random Access Memory Technology", IEEE Trans. on Magnetics, Vol. 46, No. 6, p. 2322-2327 (2010) describe the abnormal write behavior as "bifurcated switching" that increases programming voltage and degrades write margin. In FIG. 2, a plot of bit error rate (BER) vs. applied voltage across the MTJ shows a ballooning effect in the curve at low probabilities. In other words, there is another switching branch of the BER curve at a lower BER level (low probability bifurcated switching or LPBS) in a certain percentage of MTJs that is highly repeatable. While the number of MTJs showing the ballooning effect is small, and can be replaced by redundancy in principle, it is difficult to identify the problem bits without lengthy testing down to at least the $10^{-3}$ to $10^4$ level. The bifurcated switching issue is considered a soft error and has become a serious source of errors during the STT-MRAM write process.

Figure 3:
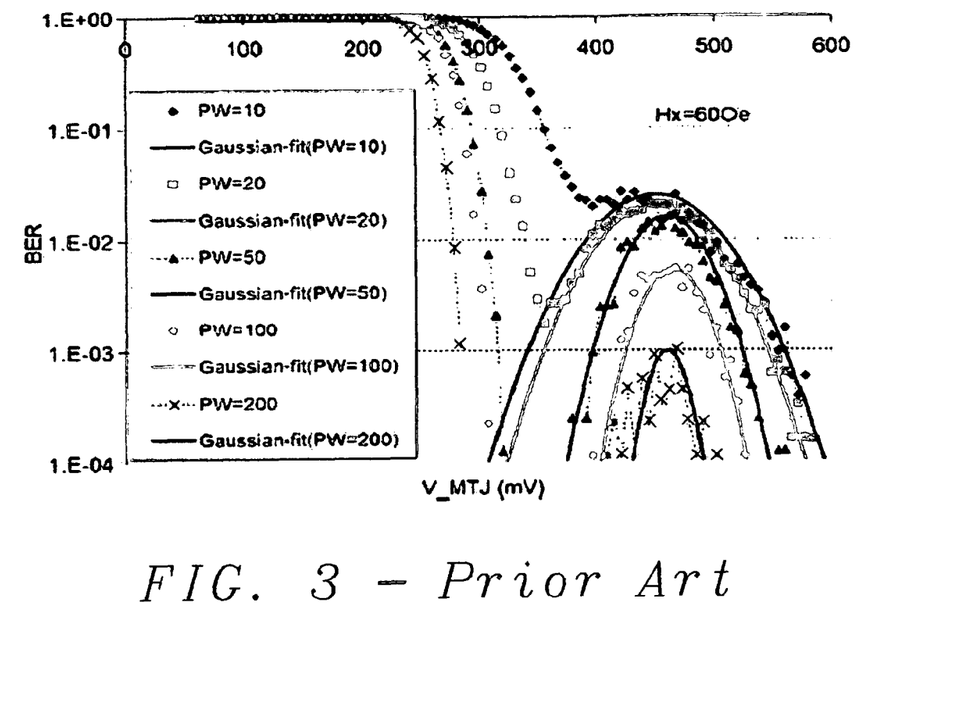
FIG. 3 is a plot of bit error rate vs. applied voltage with an assisting easy axis field of 60 Oe and shows a second type of bifurcated switching that follows a Gaussian distribution.

Another important feature of the bifurcated switching phenomenon is the pulse width dependence. As indicated in FIG. 3 that is taken from the T. Min reference, one observes the error rate caused by the intermediate states does not drop off significantly with longer pulses. Between pulse widths of 10 ns to 50 ns and with an assisting easy axis field (Hx)=60 Oe, error rate resulting from intermediate state formation during the write process does not change appreciably. In comparison, the nominal error rate from the spin torque transfer has decreased significantly between 10 ns and 50 ns pulse widths. For example, at 300 mV of applied voltage, the error rate drops off by about three decades by increasing pulse width to 50 ns from 10 ns. This behavior can be understood in terms of a relatively long lifetime of the intermediate states in the presence of a write current. Because of the long lifetime, longer pulses do not significantly reduce the intermediate state induced errors. The bifurcated switching behavior presents a serious challenge to achieving commercialization for 64 Mb STT-MRAM where a $10^{-9}$ bit error rate is needed in both read and write operations. Furthermore, shrinkage in the write margin between the minimum programming voltage for $10^{-9}$ BER and the dielectric breakdown of a MgO tunnel barrier layer is undesirable at a time when a larger write margin is needed for reliable 64 Mb STT-MRAMs.

Several strategies have been proposed to mitigate the intermediate state induced error in MTJs that exhibit the bifurcated switching problem. One idea is to modify the free layer composition to discourage the formation of domains. A second option is to use MRAM designs with much smaller MTJ size from a top-down perspective since energy considerations would make domain formation unfavorable as MTJ size becomes smaller than domain wall width. Current technology has not provided an acceptable solution to the aforementioned bifurcated switching issue. Therefore, the problem must be resolved by a method that is independent of MTJ size, and does not rely on material changes in MTJ layers that often improve one magnetic property but tend to degrade one or more other properties.

SUMMARY

One objective of the present disclosure is to provide a method to substantially reduce the bit error rate (BER) associated with intermediate state domains formed during a STT-MRAM write process without significantly changing the voltage applied across a MTJ or the total pulse width.

A second objective of the present disclosure is to provide a method according to the first objective that is readily implemented in a write process and does not adversely affect the reliability or properties of MTJ layers including the free layer, reference layer, and tunnel barrier layer.

According to one embodiment, these objectives are achieved with an integrated circuit and write method for switching a free layer in a STT-MRAM MTJ wherein a single pulse having a magnitude $a_1$ and pulse width $t_1$ in conventional write schemes is replaced by a plurality of "n" pulses separated by "n−1" domain dissipation periods during a time period $t_1$. A current applied during each domain dissipation period has a polarity opposite to the write current during the "n" pulses. Preferably, each domain dissipation period has a duration from 1 ns to 10 ns when the free layer has perpendicular magnetic anisotropy (PMA) with an anisotropy field (Hk) of about 5000 Oe and a precession frequency around 20 GHz. Thus, each domain dissipation period has a duration equivalent to or greater than 20 to 100 precessions that relates to the precession period of free layer magnetization in the absence of spin torque transfer current. Each of the plurality of "n" pulses has a write current magnitude $a_1$. However, the applied current during the "n−1" dissipation periods is minimized to a magnitude $a_2$ that is substantially smaller than $a_1$ to avoid writing in the opposite polarity. Preferably, the current with magnitude $a_2$ is less than or equal to the read current for the MTJ. The write method of the present disclosure takes advantage of a feature where one write current polarity tends to nucleate or stabilize the intermediate state domains while an opposite current polarity destabilizes or suppresses the intermediate states.

In a second embodiment, the "n" pulses and "n−1" domain dissipation periods are retained from the first embodiment. However, there is no current applied during the domain dissipation periods. Although the second embodiment may be less efficient in dissipating the intermediate state domains in the free layer, the write method may be easier to implement in circuits. Total time required for a write method described herein may be maintained equal to $t_1$ by using a plurality of "n" pulses and "n−1" domain dissipation periods each having significantly less duration than a single pulse having a pulse width $t_1$ in conventional schemes.

DETAILED DESCRIPTION

The present disclosure is an integrated circuit and write method (process) for selectively switching a MTJ memory element in a STT-MRAM wherein a single pulse over a time period $t_1$ in conventional writing is replaced by a plurality of "n" pulses separated by "n−1" domain dissipation periods wherein a current applied during a domain dissipation period has a polarity opposite to the write current during the "n" pulses. As a result, low probability bifurcated switching behavior of free layer magnetization is substantially diminished and bit error rate (BER) is lowered to a level required for high performance STT-MRAM devices to be competitive with other memory technologies. Although the drawings depict a certain STT-MRAM design, it should be understood that the write method of the present disclosure provides similar benefits when integrated with other circuit designs that are used to switch a free layer magnetization in a STT-MRAM structure. The term "pulse" may be used interchangeably with "write current".

Figure 4:
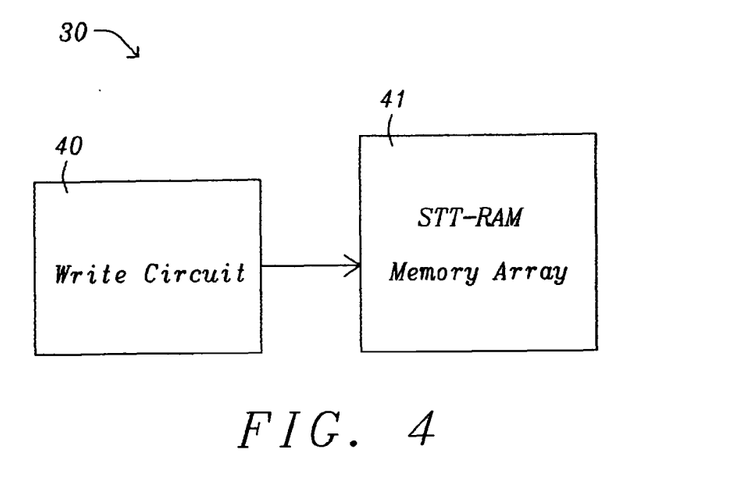
FIG. 4 is a block diagram of a memory device.

Referring to FIG. 4, a block diagram is depicted for a STT-MRAM device 1 and comprises a write circuit 10 that is integrated with a memory array 11. It is understood that a memory array typically includes a plurality of memory elements arranged in rows and columns (not shown) where each memory element or magnetic tunnel junction (MTJ) is formed between a bit line and a word line.

Figure 5:
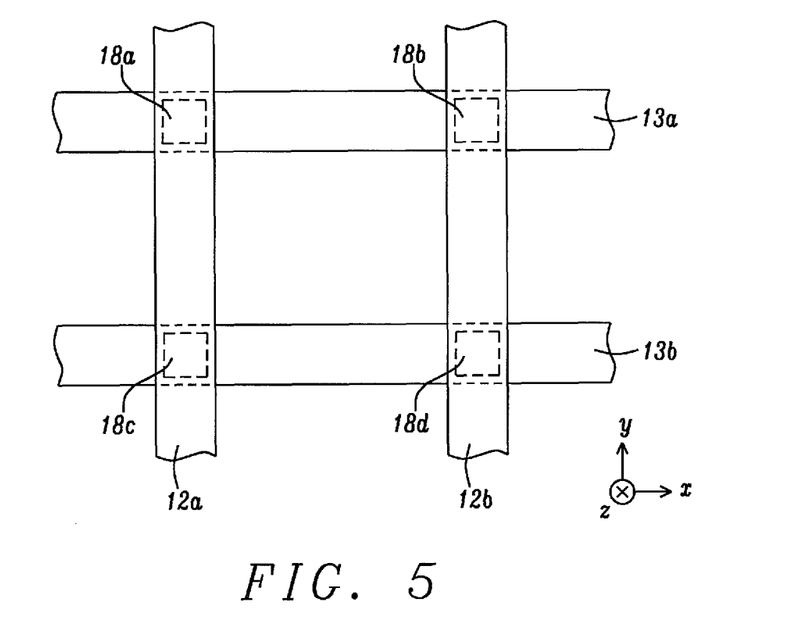
FIG. 5 is a top-down view of a portion of a memory array in a memory device.

In FIG. 5, a top-down view of a portion of the memory array 11 is pictured. The number of bit lines and word lines is limited to two each in order to simplify the drawing and clearly show that a MTJ element is formed at each location where a bit line 12a or 12b crosses over a word line 13a or 13b. Thus, MTJ elements 18a-18d are illustrated and are shown with a rectangular or square shape. However, MTJ's may also have a circular or elliptical shape from a top-down view. In the exemplary embodiment, each MTJ layer lies in an (x, y) plane and a thickness dimension of each MTJ and layers therein is in a z-axis direction. During a write process, MTJ 18a, for example, may be selectively switched from a "0" to a "1" memory state, or from a "1" to a "0" memory state by using bit line 12a, word line 13a, and a source line (not shown) to direct a current with a write duration (pulse width) through the MTJ. A controller and circuit design for selectively accessing a certain MTJ in a STT-MRAM array during a write process is known in the art and is not described herein. This disclosure is related to a write method once a MTJ has been selectively accessed by a control mechanism.

Figure 6:
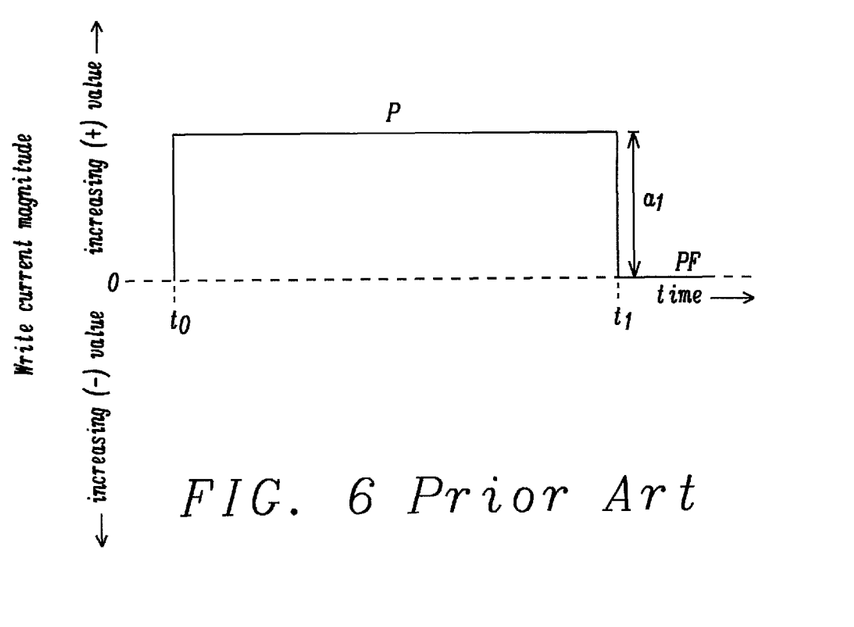
FIG. 6 is a plot of time vs. write pulse magnitude that depicts a conventional write process involving a single write pulse during a certain period of time.

Referring to FIG. 6, a conventional write method for switching a magnetization direction of a free layer in a MTJ and thereby writing a "0" or "1" memory state involves applying a write current of sufficient magnitude $a_1$ starting at time $t_0$ and ending a time $t_1$ for a total pulse width of $(t_1-t_0)$. The pulse width may be from around 1 ns to hundreds of nanoseconds. As indicated previously, a standard write process in a STT-MRAM device leads to bifurcated switching issues that cause an increase in BER. Furthermore, longer pulse widths do not significantly reduce the intermediate domain state induced errors. Rather than trying to suppress the formation of these intermediate states by changing the free layer magnetic properties or reducing MTJ size to less than a domain wall width, our approach is to dissipate the intermediate domain states immediately after they form and thereby alleviate the undesirable effects of the bifurcated switching behavior on the writing process.

Figure 7:
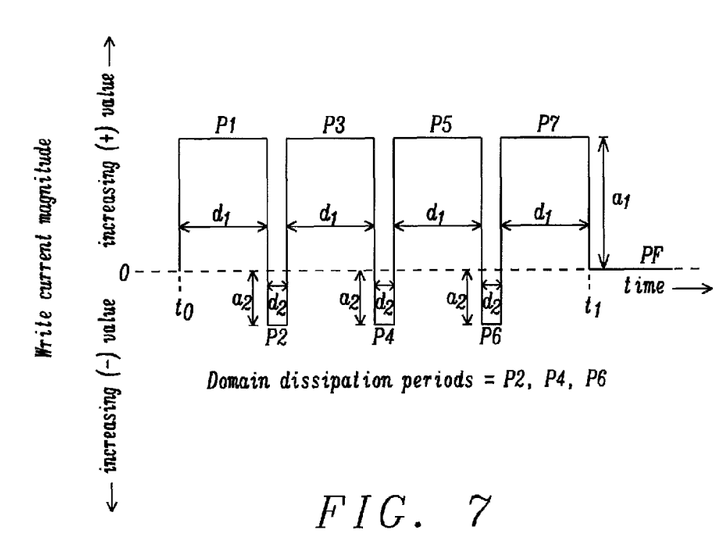
FIG. 7 is a first write method for dissipating intermediate state domains in a STT-MRAM MTJ according to a first embodiment of the present disclosure.

Referring to FIG. 7, a first embodiment of the present disclosure is illustrated and shows a write method for a MTJ in a STT-MRAM. The plot shows a time factor along the horizontal axis, and a write current magnitude along the vertical axis. In effect, total write time between $t_0$ and $t_1$ is divided into a plurality of segments comprising at least two write periods where a write current of magnitude $a_1$ with a first polarity is applied across the MTJ, and a domain dissipation period between successive write periods where a current of magnitude $a_2$ and of opposite polarity to $a_1$ is applied across the MTJ. Thus, a first current flows in a first direction through the MTJ during each write period, and a second current flows through the MTJ in a direction opposite to that of the first direction during each domain dissipation period. It is important to maintain the same current direction during each write period to prevent switching the free layer to a different magnetic state after the initial write period. In one embodiment, the first current flows from a top surface to a bottom surface of the MTJ while the second current flows from the bottom surface to the top surface of the MTJ. Preferably, the absolute value of $a_1$ is substantially greater than the absolute value of $a_2$. In one aspect, $a_2$ is less than or equal to the read current magnitude for the MTJ. For example, if write current of magnitude $a_1$ is generated by a voltage (V) of about 1 volt across the MTJ, then the voltage used to produce a current with magnitude $a_2$ may be approximately 0.1 volt or less. In other words, $a_2$ should not be large enough to switch the free layer magnetization direction determined by a preceding write period.

The most general form of the first embodiment comprises "n" write periods and "n−1" domain dissipation periods where n≥2, and each write period except for the final write period is separated from the next write period by a domain dissipation period. Although a positive value is shown for $a_1$ and a negative value for $a_2$, the write scheme is equally effective when $a_1$ is a negative value for each write period, and $a_2$ is a positive value during each domain dissipation period.

According to one embodiment, total time $(t_1-t_0)$ and voltage (V) required for the "n" write periods in FIG. 7 are substantially the same as the pulse width $(t_1-t_0)$ and the voltage associated with a single pulse with magnitude $a_1$ in a prior art write process (FIG. 6) we have practiced. Preferably, $a_1$ in this disclosure is generated by a voltage of about 0.05 to 1.5 volts across the MTJ.

In the exemplary embodiment, there are four write periods that are labeled P1, P3, P5, and P7. A first domain dissipation period P2 follows P1, a second domain dissipation period P4 is between P3 and P5, and a third domain dissipation period P6 is between P5 and P7. According to one aspect, all of the write periods have the same pulse width or duration $d_1$, and all of the domain dissipation periods have the same duration $d_2$. However, the present disclosure also anticipates that one or more of write periods may have a duration unequal to $d_1$. Moreover, one or more of domain dissipation periods may have a duration unequal to $d_2$. Preferably, $d_1$ is substantially larger than $d_2$ and each of the periods P2, P4, and P6 has a duration or pulse width in the range of 1 ns to 10 ns when the free layer in the MTJ has perpendicular magnetic anisotropy (PMA) with an anisotropy field (Hk) of about 5000 Oe and a precession frequency around 20 GHz. Thus, it is important for each domain dissipation period to have a duration $d_2$ equivalent to 20 to 100 precessions. In another embodiment, $d_1$ is equal to or greater than $d_2$. PF at the right side of FIG. 7 indicates a final time period where no current is applied across the MTJ and the write process is terminated.

The present disclosure also encompasses an embodiment where the magnitude of $a_1$ for write period P1 differs from the write current magnitude in one or more subsequent write periods within the same write process having a total pulse width $t_1=nd_1+(n-1)d_2$ where "n" is the number of write periods. In fact, all of the write periods may have different values for $a_1$ providing the absolute value of each current magnitude $a_1$ during the "n" write periods is substantially greater than the absolute value for $a_2$ of the applied current in each of the domain dissipation periods. However, one skilled in the art will appreciate that keeping $a_1$ at a constant value for each write period may be easier to implement in a write process than one involving a plurality of $a_1$ values. Likewise, the $a_2$ magnitude in the first domain dissipation period P2 may differ from one or more of the $a_2$ values in subsequent domain dissipation periods within the same write process. Preferably, the $a_2$ value in each of the "n−1" domain dissipation periods is substantially less than the write current magnitude in preceding write periods within the same write process to avoid switching the free layer magnetization that is set during a previous write period.

Figure 8:
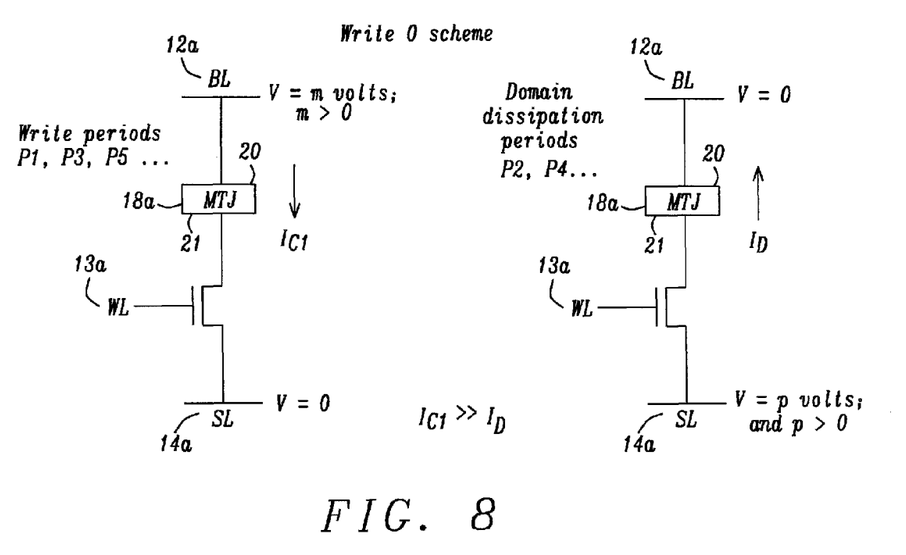
FIG. 8 is a circuit diagram for a writing a "0" memory state in a STT-MRAM MTJ using the first write method in FIG. 7.

In FIG. 8, an exemplary write circuit layout is depicted for a write process where a "0" magnetic state is written to MTJ 18a according to a first embodiment of the present disclosure. According to one embodiment, word line (WL) 13a is used to select MTJ 18a for a write process. Typically, a write current $I_{C1}$ is driven across the MTJ between bit line (BL) 12a and source line (SL) 14a and is of sufficient magnitude to induce the spin transfer effect and switch the magnetization direction in the MTJ's free layer. Current $I_{C1}$ flows in a direction from a MTJ top surface 20 to a bottom surface 21. According to one embodiment where the write current passes from BL to SL through the MTJ, BL is set to "m" volts where m>0, and SL is set to 0 V during each of the plurality of write periods depicted in FIG. 7. As a result, $I_{C1}$ has magnitude $a_1$ as mentioned previously. Moreover, during each of the domain dissipation periods including P2, P4, and P6 in FIG. 7, a current $I_D$ is applied across the MTJ in an opposite direction to $I_{C1}$ that is applied during a preceding write period. SL is set to "p" volts where p>0 and BL is set to 0 V. It is important that $I_{C1}$ with magnitude $a_1$ is substantially greater than $I_D$ with magnitude $a_2$. For example, $a_1$ may be an order of magnitude greater than $a_2$. At time $t_1$ and during period PF, both SL and BL are set to 0 V to terminate the write process.

Figure 9:
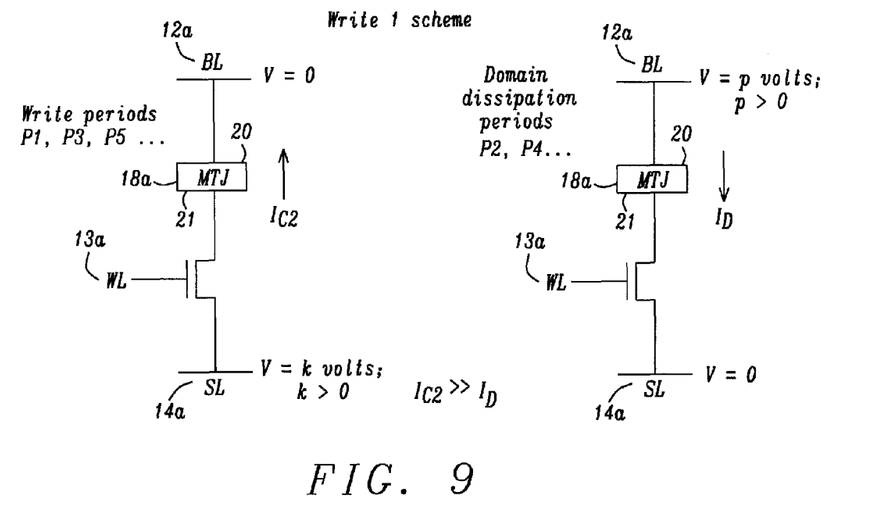
FIG. 9 is a circuit diagram for writing a "1" memory state in a STT-MRAM using the first write method in FIG. 7.

Referring to FIG. 9, another write process is depicted wherein a "1" magnetic state is written to a MTJ in a STT-MRAM structure according to a first embodiment of the present disclosure. Here, a write current $I_{C2}$ is driven across MTJ 18a from a bottom surface 21 to a top surface 20. Current $I_{C2}$ flows between SL 14a and BL 12a and is of sufficient magnitude to induce the spin transfer effect and switch the magnetization direction in the MTJ's free layer. According to one embodiment where the write current passes from SL to BL through the MTJ, SL is set to "k" volts where k>0, and BL is set to 0 V during each of the plurality of write periods P1, P3, P5, and P7 depicted in FIG. 7. Note that the magnitude "k" during the write 1 process is not necessarily equal to magnitude "m" during the write 0 process. Thus, the value of $a_1$ for write current $I_{C2}$ may be different from the value of $a_1$ for $I_{C1}$ in FIG. 8. During each of the domain dissipation periods such as P2, P4, and P6 described in FIG. 7, a current $I_D$ is applied across the MTJ in an opposite direction to $I_{c2}$ where $I_{c2}$ is substantially greater than $I_D$. Preferably, $I_D$ has an absolute value for magnitude $a_2$ that is less than or equal to the absolute value of the read current for the MTJ. At time $t_1$ and during period PF, both SL and BL are set to 0 V to terminate the write process.

Figure 10:
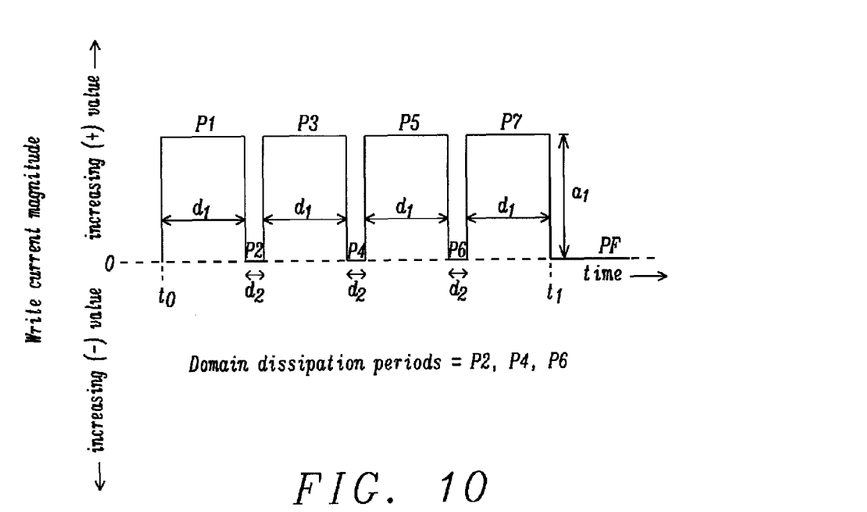
FIG. 10 is a second write method for dissipating intermediate state domains in a STT-MRAM MTJ according to a second embodiment of the present disclosure.

According to a second embodiment of the present disclosure illustrated in FIG. 10, a write process is shown for a MTJ in a STT-MRAM that retains the plurality of "n" write periods and "n−1" domain dissipation periods previously described in the first embodiment. Furthermore, the duration $d_1$ and current magnitude $a_1$ are retained from the first embodiment as depicted in the exemplary embodiment where there are four write periods P1, P3, P5, and P7. Unlike the previous embodiment, there is no current flow through the MTJ during domain dissipation periods P2, P4, and P6. However, it is still important to maintain the same direction for current flow through the MTJ during the plurality of write periods to prevent switching the free layer to a different magnetic state after the initial write period. In one embodiment, the current during each of the plurality of write periods flows from a top surface to a bottom surface of the MTJ. According to a second write process, the current during each of the plurality of write periods flows from a bottom surface to a top surface of the MTJ.

Preferably, all of the write periods have the same pulse width or duration $d_1$, and all of the domain dissipation periods have the same duration $d_2$. However, the present disclosure also anticipates that one or more of write periods may have a duration unequal to $d_1$. Moreover, one or more of domain dissipation periods may have a duration unequal to $d_2$. Preferably, $d_1$ is substantially larger than $d_2$ and each of the domain dissipation periods has a duration in the range of 1 ns to 10 ns when the free layer in the MTJ has perpendicular magnetic anisotropy (PMA) with an anisotropy field (Hk) of about 5000 Oe and a precession frequency around 20 GHz. According to another embodiment, $d_1$ is equal to or greater than $d_2$. It is important for each domain dissipation period to have a duration $d_2$ greater than or equal to the precession period of free layer magnetization in the absence of spin torque transfer current. Period PF at the right side of FIG. 10 indicates a final time period where no current is applied across the MTJ and the write process is terminated.

The present disclosure also encompasses an embodiment where the magnitude of $a_1$ for write period P1 differs from the write current magnitude $a_1$ in one or more subsequent write periods within the same write process having a total pulse width $t_1 = nd_1 + (n-1)d_2$ where "n" is the number of write periods. All of the write periods may have different values for $a_1$ providing the current applied during each of the "n" write periods is of sufficient magnitude to switch the free layer magnetization direction in the MTJ. As indicated earlier, a write process comprising a constant $a_1$ value during all write periods is anticipated to be easier to implement in a STT-MRAM device than one involving a plurality of $a_1$ values.

Figure 11:
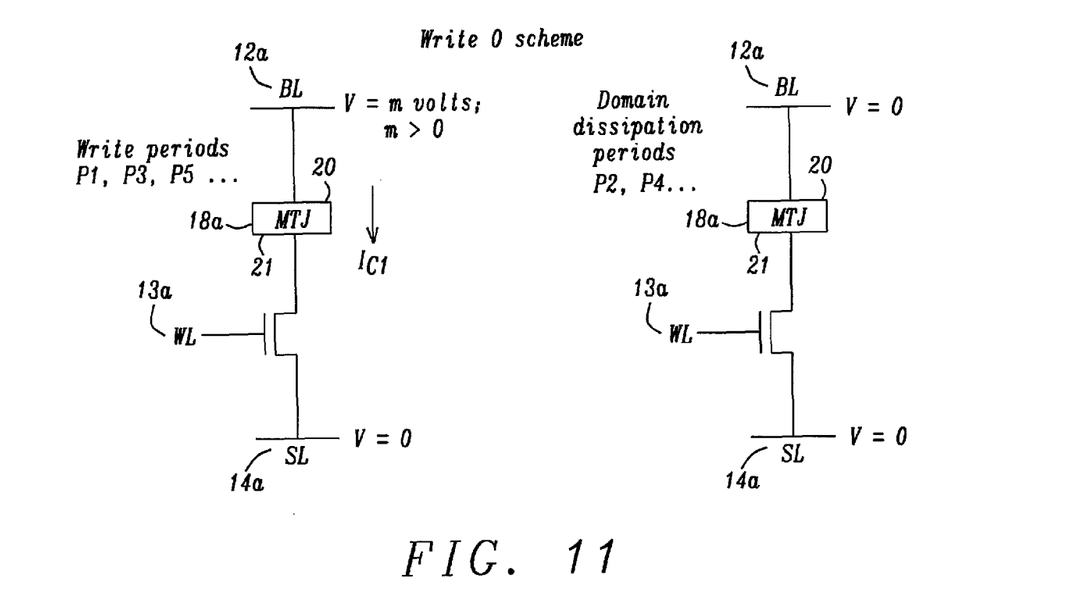
FIG. 11 is a circuit diagram for writing a "0" memory state in a STT-MRAM MTJ using the second write method in FIG. 10.

Referring to FIG. 11, an exemplary circuit layout is depicted for a write process where a "0" magnetic state is written to MTJ 18a in a STT-MRAM according to a second embodiment of the present disclosure. Typically, a write current $I_{C1}$ is driven across the MTJ between BL 12a and SL 14a and is of sufficient magnitude to induce the spin transfer effect and switch the magnetization direction in the MTJ's free layer. Current $I_{C1}$ flows in a direction from a MTJ top surface 20 to a bottom surface 21. According to one embodiment where the write current passes from BL to SL through the MTJ, BL is set to "m" volts where m>0, and SL is set to 0 V during each of the plurality of write periods depicted in FIG. 10. As a result, $I_{C1}$ has magnitude $a_1$ as mentioned previously. Moreover, during each of the domain dissipation periods including P2, P4, and P6, both SL and BL are set to 0 V so there is no current flowing across the MTJ. At time $t_1$ and during final period PF, both SL and BL are set to 0 V to terminate the write process.

Figure 12:
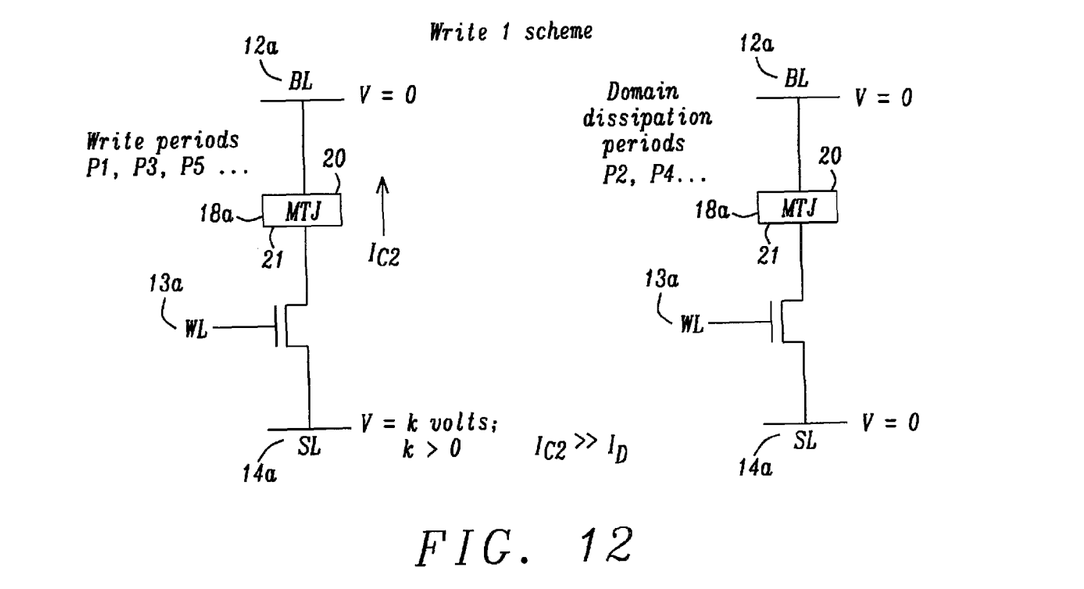
FIG. 12 is a circuit diagram for writing a "1" memory state in a STT-MRAM MTJ using the second write method in FIG. 10.

Referring to FIG. 12, another write process is depicted wherein a "1" magnetic state is written to a MTJ in a STT-MRAM structure according to the second embodiment of the present disclosure. In this case, a write current $I_{c2}$ is driven across MTJ 18a from a bottom surface 21 to a top surface 20. Current $I_{c2}$ flows between SL 14a and BL 12a and is of sufficient magnitude to induce the spin transfer effect and switch the magnetization direction in the MTJ's free layer. According to one embodiment where the write current passes from SL to BL through the MTJ, SL is set to "k" volts where k>0, and BL is set to 0 V during each of the plurality of write periods P1, P3, P5, and P7 depicted in FIG. 10. It should be understood that the magnitude "k" during the write 1 process is not necessarily equal to magnitude "m" during the write 0 process described with regard to FIG. 11. As a result, the value of $a_1$ for write current $I_{c2}$ may be different from the value of $a_1$ for $I_{C1}$ in a write 0 process. During each of the domain dissipation periods including P2, P4, and P6, there is no current applied to the MTJ. At time $t_1$ and during period PF, both SL and BL are set to 0 V to terminate the write process.

The present disclosure also encompasses a third embodiment that combines the features of the first and second embodiments. According to one write process, when the number of write pulses "n" is three or greater, at least one of the "n−1" domain dissipation periods involves applying a current across the MTJ in a direction opposite to that of a first current during the "n" pulses as described in the first embodiment. Furthermore, at least one of the domain dissipation periods comprises no applied current across the MTJ as previously described in the second embodiment.

Figure 13:
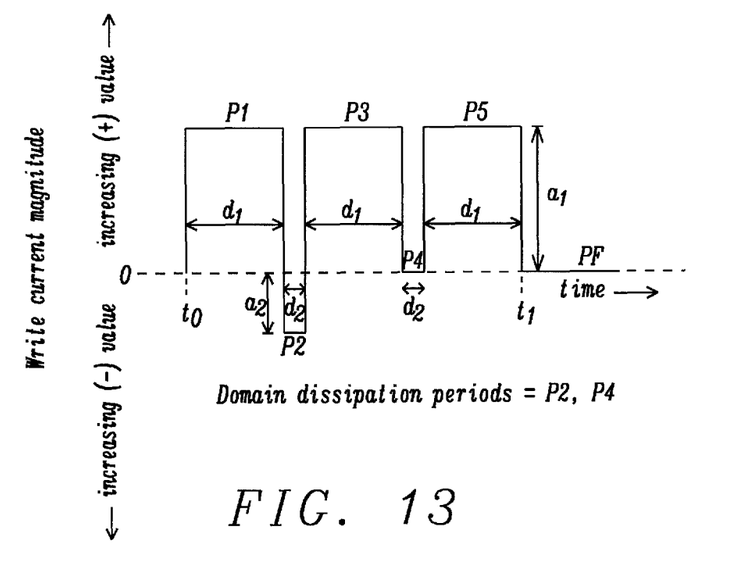
FIG. 13 is a third write method for dissipating intermediate state domains in a STT-MRAM MTJ according to a third embodiment of the present disclosure wherein at least one domain dissipation period has applied current and at least one domain dissipation period has no current applied to the MTJ.

In the exemplary embodiment depicted in FIG. 13, write periods P1 and P3 are separated by a domain dissipation period P2 wherein a second current of opposite polarity to the first current in P1, P3 is applied across the MTJ. Write periods P3 and P5 are separated by a domain dissipation period P4 where no current is applied to the MTJ. Optionally, P2 may comprise a condition where no current is applied to the MTJ while P4 may comprise a condition where a second current of opposite polarity to the first current is applied. Obviously, as "n" becomes greater than three, the write process of the third embodiment may result in multiple combinations of a second current or no current in the plurality of domain dissipation periods. For example, when n=4 (not shown), there are six possible combinations where at least one of the three domain dissipation periods comprise a second current of opposite polarity to that of the first current in the four write periods, and at least one of three domain dissipation periods comprise no current applied across the MTJ.

We have disclosed three embodiments for a write process wherein the bit error rate associated with intermediate domain states in a STT-MRAM MTJ is substantially reduced using current materials and existing in-plane dimensions for memory elements. The advantages of the present disclosure are realized without changing the total pulse width or write voltage associated with current write processes.

While the present disclosure has been particularly shown and described with reference to, the preferred embodiment thereof, it will be understood by those skilled in the art that various changes in form and details may be made without departing from the spirit and scope of this disclosure.

We claim:

1. A write method to switch a free layer magnetization direction in a magnetic tunnel junction (MTJ) in a STT-MRAM device, comprising:
    (a) providing an array of memory elements and selectively accessing a MTJ with a write circuit;
    (b) applying a first current of sufficient magnitude to switch a free layer having perpendicular magnetic anisotropy (PMA) and with a precession frequency proximate to 20 GHz in the MTJ during a plurality of "n" write periods, the first current is applied between a bit line and a source line and flows through the MTJ in a first direction during each of the write periods;
    (c) applying a second current with a magnitude less than required to switch the free layer magnetization during "n−1" domain dissipation periods wherein a domain dissipation period follows each write period except for a final write period and has a duration of 20 to 100 free layer precessions, the second current is applied between the source line and the bit line and flows through the MTJ in a direction opposite to that of the first direction; and
    (d) terminating the write process by applying no current to the MTJ during a final period of time.

2. The write method of claim 1 wherein the free layer has an anisotropy field (Hk) proximate to 5000 Oe.

3. The write method of claim 2 wherein each domain dissipation period has a duration or pulse width of about 1 nanosecond to 10 nanoseconds.

4. The write method of claim 1 wherein each domain dissipation period has a second current with a magnitude less than or equal to a read current that is used to detect a resistance in the MTJ.

5. The write method of claim 1 wherein a magnitude of the first current during a first write period is different from a magnitude of the first current during a subsequent write period.

6. The write method of claim 1 wherein a magnitude of the second current during a first domain dissipation period is different from a magnitude of the second current during a subsequent domain dissipation period.

7. The write method of claim 1 wherein a pulse width of a first write period is unequal to a pulse width of one or more subsequent write periods.

8. The write method of claim 1 wherein a pulse width of a first domain dissipation period is unequal to a pulse width of one or more subsequent domain dissipation periods.

9. The write method of claim 1 wherein the first current has a magnitude $a_1$ and a pulse width $d_1$ during each of the write periods, and wherein the second current has a magnitude $a_2$ and a pulse width $d_2$ during each domain dissipation period where $d_2$ is equal to or less than $d_1$, and $a_2$ is substantially less than $a_1$.

10. The write method of claim 9 wherein $a_1$ is generated by a voltage across the MTJ of about 0.05 to 1.5 volts.

11. The write method of claim 9 wherein a "0" magnetic state is written to the MTJ by applying a positive voltage to the bit line and a zero voltage to the source line during each of the write periods, and applying a positive voltage to the source line and a zero voltage to the bit line during each domain dissipation period.

12. The write method of claim 11 wherein a "1" magnetic state is written to the MTJ by applying a positive voltage to the source line and a zero voltage to the bit line during each of the write periods, and applying a positive voltage to the bit line and a zero voltage to the source line during each domain dissipation period.

13. The write method of claim 12 wherein the first current applied to write a "0" magnetic state is unequal to the first current applied to write a "1" magnetic state.

14. An integrated circuit, comprising:
    (a) an array of memory elements; and
    (b) a write circuit configured to switch a selected memory element from a first magnetic state to a second magnetic state by a process comprising:
        (1) applying a first current of sufficient magnitude to switch a free layer magnetic state in the selected memory element during a plurality of "n" write periods wherein the free layer has perpendicular magnetic anisotropy (PMA) and a precession frequency proximate to 20 GHz, the first current is applied between a bit line and a source line and flows through the selected memory element in a first direction during each of the write periods; and
        (2) applying a second current with a magnitude less than required to switch the free layer magnetic state during "n−1" domain dissipation periods wherein a domain dissipation period follows each write period except for a final write period and has a duration of 20 to 100 free layer precessions, the second current is applied between the source line and the bit line and flows through the selected memory element in a direction opposite to that of the first direction.

15. The integrated circuit of claim 14 wherein each domain dissipation period has a duration or pulse width of about 1 nanosecond to 10 nanoseconds.

16. The integrated circuit of claim 14 wherein each domain dissipation period has a second current with a magnitude less than or equal to a read current that is used to detect a resistance in the selected memory element.

17. The integrated circuit of claim 14 wherein the first current has a magnitude $a_1$ and a pulse width $d_1$ during each of the write periods, and wherein the second current has a magnitude $a_2$ and a pulse width $d_2$ during each domain dissipation period where $d_2$ is less than or equal to $d_1$, and $a_2$ is substantially less than $a_1$.

18. The integrated circuit of claim 17 wherein $a_1$ is generated by a voltage across the MTJ of about 0.05 to 1.5 volts.

19. A write method to switch a free layer magnetization direction in a magnetic tunnel junction (MTJ) that is a memory element in a STT-MRAM device, comprising:
  (a) providing an array of MTJs and selectively accessing a MTJ with a write circuit;
  (b) applying a first current of sufficient magnitude to switch a free layer having perpendicular magnetic anisotropy and a precession frequency proximate to 20 GHz in the selected MTJ during a plurality of "n" write periods, the first current is applied between a bit line and a source line and flows through the selected MTJ in a first direction during each of the write periods;
  (c) applying no current to the selected MTJ during "n−1" domain dissipation periods wherein a domain dissipation period has a duration of 20 to 100 free layer precessions that relates to a precession period of free layer magnetization in the absence of a spin torque transfer current and follows each write period except for a final write period; and
  (d) terminating the write process by applying no current to the selected MTJ after a final write period.

20. The write method of claim 19 wherein the free layer has an anisotropy field (Hk) proximate to 5000 Oe.

21. The write method of claim 19 wherein the first current has a magnitude $a_1$ and a duration or pulse width $d_1$ during each of the write periods, and each domain dissipation period comprises a duration $d_2$ where $d_2$ is less than or equal to $d_1$.

22. The write method of claim 21 wherein $d_2$ is from about 1 nanosecond to 10 nanoseconds.

23. The write method of claim 21 wherein $a_1$ is generated by a voltage across the selected MTJ of about 0.05 to 1.5 volts.

24. The write method of claim 19 wherein a "0" magnetic state is written to the selected MTJ by applying a positive voltage to the bit line and a zero voltage to the source line during each of the write periods.

25. The write method of claim 24 wherein a "1" magnetic state is written to the selected MTJ by applying a positive voltage to the source line and a zero voltage to the bit line during each of the write periods.

26. The write method of claim 25 wherein the first current applied to write a "0" magnetic state is unequal to the first current applied to write a "1" magnetic state.

27. An integrated circuit, comprising:
  (a) an array of memory elements; and
  (b) a write circuit configured to switch a selected memory element from a first magnetic state to a second magnetic state, the selected memory element has a free layer with perpendicular magnetic anisotropy, by a process comprising:
    (1) applying a current of sufficient magnitude to switch a free layer magnetic state in the selected memory element during a plurality of "n" write periods wherein the free layer has a precession frequency proximate to 20 GHz, the current is applied between a bit line and a source line and flows through the selected memory element in a first direction during each of the write periods; and
    (2) applying no current to the selected memory element during "n−1" domain dissipation periods wherein a domain dissipation period has a duration of 20 to 100 free layer precessions that relates to a precession period of free layer magnetization in the absence of a spin torque transfer current and follows each write period except for a final write period.

28. The integrated circuit of claim 27 wherein each domain dissipation period has a duration of about 1 nanosecond to 10 nanoseconds.

29. The integrated circuit of claim 28 wherein the current has a magnitude $a_1$ and a pulse width $d_1$ during each of the write periods where $d_2$ is less than or equal to $d_1$.

30. The integrated circuit of claim 29 wherein $a_1$ is generated by a voltage across the selected memory element of about 0.05 to 1.5 volts.

31. The integrated circuit of claim 27 wherein a magnitude of the first current during a first write period is different from a magnitude of the first current during a second write period.

32. A write method to switch a free layer magnetization direction in a magnetic tunnel junction (MTJ) in a STT-MRAM device, comprising:
  (a) providing an array of memory elements and selectively accessing a MTJ with a write circuit, the MTJ has a free layer with perpendicular magnetic anisotropy;
  (b) applying a first current of sufficient magnitude to switch a free layer in the MTJ during a plurality of "n" write periods where n≥3 and the free layer has a precession frequency proximate to 20 GHz, the first current is applied between a bit line and a source line and flows through the MTJ in a first direction during each of the write periods; and
  (c) applying a second current with a magnitude less than required to switch the free layer magnetization during at least one domain dissipation period, and applying no current to the MTJ during at least one domain dissipation period that relates to a precession period of free layer magnetization in the absence of a spin torque transfer current wherein a domain dissipation period has a duration from 20 to 100 free layer precessions and follows each write period except for a final write period, the second current is applied between the source line and the bit line and flows through the MTJ in a direction opposite to that of the first direction.

33. The write method of claim 32 wherein each domain dissipation period has a duration $d_2$ that is greater than or equal to a precession period of free layer magnetization in the absence of a spin torque transfer current.

34. The write method of claim 33 wherein $d_2$ is from about 1 nanosecond to 10 nanoseconds.

35. The write method of claim 33 wherein the second current has a magnitude $a_2$ which is less than or equal to a magnitude of a read current used to measure a resistance in the MTJ.

36. The write method of claim 35 wherein the first current has a magnitude $a_1$ and a duration or pulse width $d_1$ where $d_2$ is less than or equal to $d_1$.

37. The write method of claim 36 wherein $a_1$ is generated by applying a voltage across the MTJ of about 0.5 to 1.5 volts.

38. The write method of claim 32 wherein a duration of a first domain dissipation period is unequal to a duration of a second domain dissipation period.

39. The write method of claim 32 wherein a magnitude of the first current during a first write period is unequal to a magnitude of the first current during a subsequent write period.

* * * * *